US010784875B2

(12) United States Patent
Nagaraj et al.

(10) Patent No.: US 10,784,875 B2
(45) Date of Patent: Sep. 22, 2020

(54) LOOP FILTER FOR A PHASE-LOCKED LOOP

(71) Applicant: TEXAS INSTRUMENTS INCORPORATED, Dallas, TX (US)

(72) Inventors: Krishnaswamy Nagaraj, Plano, TX (US); Wei Fu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/231,568

(22) Filed: Dec. 23, 2018

(65) Prior Publication Data
US 2020/0204183 A1 Jun. 25, 2020

(51) Int. Cl.
| | | |
|---|---|---|
| *H03K 5/04* | (2006.01) | |
| *H03L 7/06* | (2006.01) | |
| *H03B 1/00* | (2006.01) | |
| *H04B 1/10* | (2006.01) | |
| *H03L 7/089* | (2006.01) | |
| *H03L 7/093* | (2006.01) | |
| *H03L 7/18* | (2006.01) | |
| *H03L 7/099* | (2006.01) | |

(52) U.S. Cl.
CPC ............ *H03L 7/0891* (2013.01); *H03L 7/093* (2013.01); *H03L 7/099* (2013.01); *H03L 7/18* (2013.01); *H03L 2207/06* (2013.01)

(58) Field of Classification Search
CPC ......... H03L 7/0891; H03L 7/099; H03L 7/18; H03L 7/093; H03L 2207/06
See application file for complete search history.

(56) References Cited

U.S. PATENT DOCUMENTS

| | | | | |
|---|---|---|---|---|
| 4,559,505 A | * | 12/1985 | Suarez | .................... H03L 7/093 331/1 A |
| 7,928,785 B2 | * | 4/2011 | Choi | ..................... H03L 7/0891 327/156 |
| 8,299,826 B2 | * | 10/2012 | Perrott | ................ H03H 19/008 327/156 |
| 8,432,204 B1 | | 4/2013 | Chern et al. | |

(Continued)

FOREIGN PATENT DOCUMENTS

CN 10877148 A 8/2018

OTHER PUBLICATIONS

Michael H. Perrott. "Tutortial on Digital Phase-Locked Loops." CICC 2009. Sep. 2009.

(Continued)

*Primary Examiner* — Kenneth B Wells
(74) *Attorney, Agent, or Firm* — Brian D. Graham; Charles A. Brill; Frank D. Cimino

(57) ABSTRACT

A circuit includes a first filter, a plurality of binary-weighted capacitors, and a current source device. The circuit also includes a first plurality of switches. Each of the first plurality of switches is connected to a separate capacitor of the plurality of binary-weighted capacitors. The first plurality of switches are connected together, and the first plurality of switches are not connected to the first filter. A second plurality of switches is also included, and each of the second plurality of switches is connected to a separate capacitor of the plurality of binary-weighted capacitors and to the first filter and to a control input of the current source device. The first plurality of switches are not connected to the control input.

18 Claims, 2 Drawing Sheets

(56) References Cited

U.S. PATENT DOCUMENTS

| | | | | |
|---|---|---|---|---|
| 8,674,754 | B2* | 3/2014 | Neurauter | H03D 13/004 |
| | | | | 327/156 |
| 8,836,390 | B2* | 9/2014 | Kuo | H03L 7/07 |
| | | | | 327/148 |
| 9,024,684 | B2* | 5/2015 | Song | H03L 7/0802 |
| | | | | 327/156 |
| 9,490,824 | B1* | 11/2016 | Singh | H03L 7/0891 |
| 2006/0076990 | A1* | 4/2006 | Mayer | H03L 7/093 |
| | | | | 327/156 |
| 2006/0226896 | A1* | 10/2006 | Dosho | H03D 13/004 |
| | | | | 327/554 |
| 2012/0133405 | A1 | 5/2012 | Jain et al. | |

OTHER PUBLICATIONS

International Search Report for PCT/US2019/066467 dated Apr. 30, 2020.

* cited by examiner

LOOP FILTER FOR A PHASE-LOCKED LOOP

BACKGROUND

Many phase-locked loops (PLLs) include a loop filter that filters a signal produced by a charge pump or other type of circuit. The output of the loop filter can be used to control, for example, a current source device which provides current to a current controlled oscillator.

SUMMARY

In one example, a circuit includes a first filter, a plurality of binary-weighted capacitors, and a current source device. The circuit also includes a first plurality of switches. Each of the first plurality of switches is connected to a separate capacitor of the plurality of binary-weighted capacitors. The first plurality of switches are connected together, and the first plurality of switches are not connected to the first filter. A second plurality of switches is also included, and each of the second plurality of switches is connected to a separate capacitor of the plurality of binary-weighted capacitors and to the first filter and to a control input of the current source device. The first plurality of switches are not connected to the control input. The circuit can be used as part of a phase-locked loop.

BRIEF DESCRIPTION OF THE DRAWINGS

For a detailed description of various examples, reference will now be made to the accompanying drawings in which.

DETAILED DESCRIPTION

An analog PLL (APLL) is disclosed. The disclosed APLL includes, among other components, a charge pump, a loop filter, and a current controlled oscillator. In some examples, the output of the loop filter is used to control a current source device that provides current to the current controlled oscillator. In practice, parasitic capacitance is present on the control input to the current source device. The parasitic capacitance can cause noise on the power supply to impact the loop filter's signal to the current source device and thus the current to the current controlled oscillator. The loop filter described herein has architecture that addresses this problem.

Figure 1:
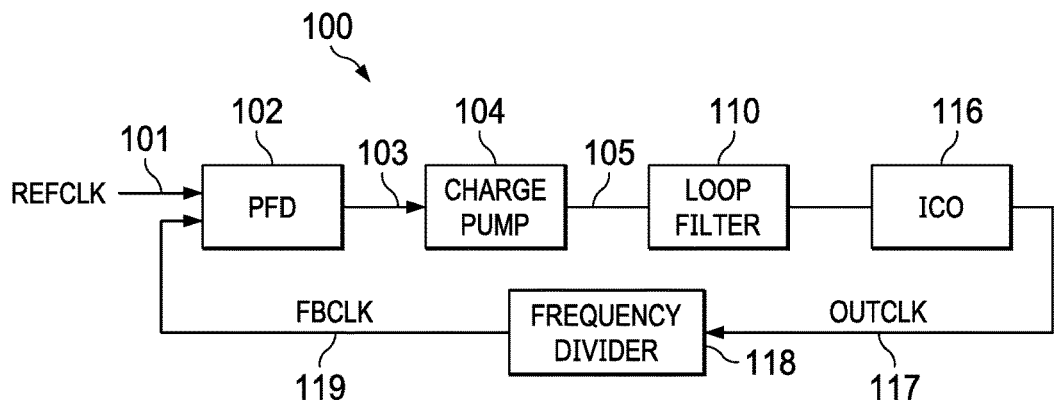
FIG. 1 illustrates an analog phase-locked loop in accordance with a disclosed example.

FIG. 1 shows an example of APLL 100. The example APLL 100 includes a phase and frequency detector 102, a charge pump 104, a loop filter 110, a current controlled oscillator (ICO) 116 and a frequency divider 118. The output signal from the ICO 116 is an output clock (OUTCLK) 117. A reference clock (REFCLK) 101 is provided to an input of the phase and frequency detector 102. In some examples, the phase and frequency detector 102 generates an error signal 103 based on the frequency and/or phase difference (error) between REFCLK 101 and OUTCLK 117. In the example of FIG. 1, the frequency of OUTCLK 117 is greater than the frequency of REFCLK 101. The frequency divider 118 divides down the frequency of OUTCLK 117 to produce a feedback clock (FBCLK) 119 that is approximately of the same frequency as REFCLK 101. Reference herein to the FBCLK 119 includes the output signal from a frequency divider (e.g., frequency divider 118) as well as to the output clock from ICO 116 in the implementation in which the frequency of OUTCLK 117 is of the same frequency as REFCLK 101.

Figure 2:
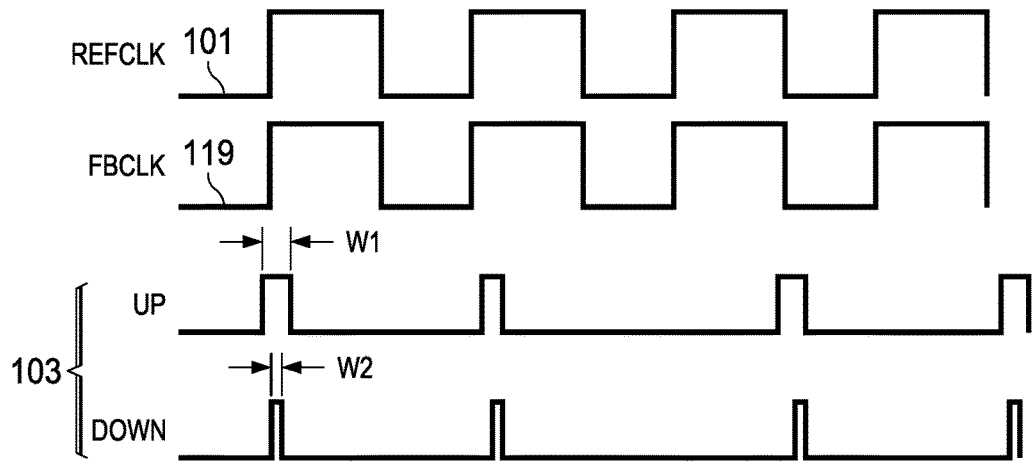
FIG. 2 illustrates waveforms of various signals of the described analog phase-locked loop.

The APLL 100 adjusts the frequency and phase of OUTCLK 117 so as to match the phase of REFCLK 101. FIG. 2 shows an example of REFCLK 101 and FBCLK 119 where the rising and falling edges of FBCLK 119 are phase aligned to the edges of REFCLK 101. FBCLK 119 is said to be "locked" on to REFCLK 101. Accordingly, OUTCLK 117 also is phase aligned to REFCLK in the locked state, although the frequency of OUTCLK 117 may be the same as or greater than that of REFCLK 101.

In some examples, the error signal 103 comprises a series of UP pulses as well as a series of DOWN pulses. FIG. 2 also shows an example of UP pulses and DOWN pulses. Responsive to the edges of FBCLK 119 lagging the corresponding edges of REFCLK 101, the phase and frequency detector 102 generates the width W1 of the UP pulses to be wider than the width W2 of the DOWN pulses. Conversely, responsive to the edges of FBCLK 119 leading the corresponding edges of REFCLK 101, the phase and frequency detector 102 generates the width W1 of the UP pulses to be narrower than the width W2 of the DOWN pulses.

Figure 3:
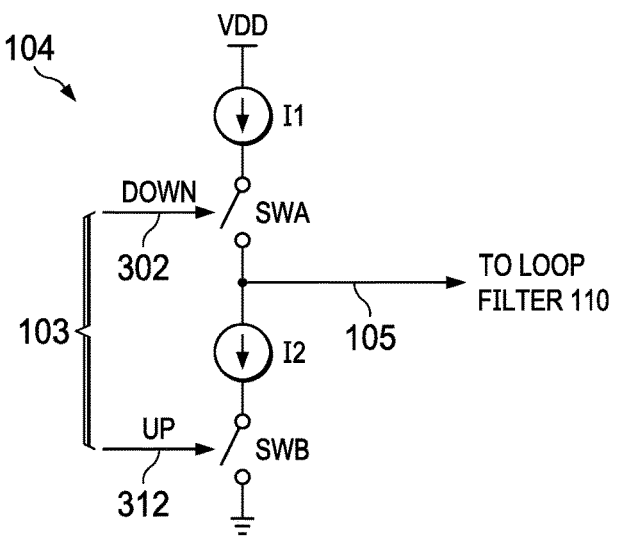
FIG. 3 shows a charge pump circuit usable in the analog phase-locked loop in accordance with an example.

FIG. 3 provides an example of charge pump 104. In this example, the charge pump 104 includes a current source device 11 coupled to a current device 12 through a selectable switch SWA. Switch SWB selectively couples 12 to ground. The DOWN pulses 302 of the error signal 103 control the on and off state of SWA and the UP pulses 312 control the on and off state of SWB. When SWA is closed by an active DOWN pulse 302, current flows through SWA and to the loop filter 110. When SWB is closed by an active UP pulse 302, current flows from the loop filter 110 through SWB to ground. Charge pump signal 105 thus includes a series of positive and negative current pulses based on the UP and DOWN pulses of the error signal 103.

Figure 4:
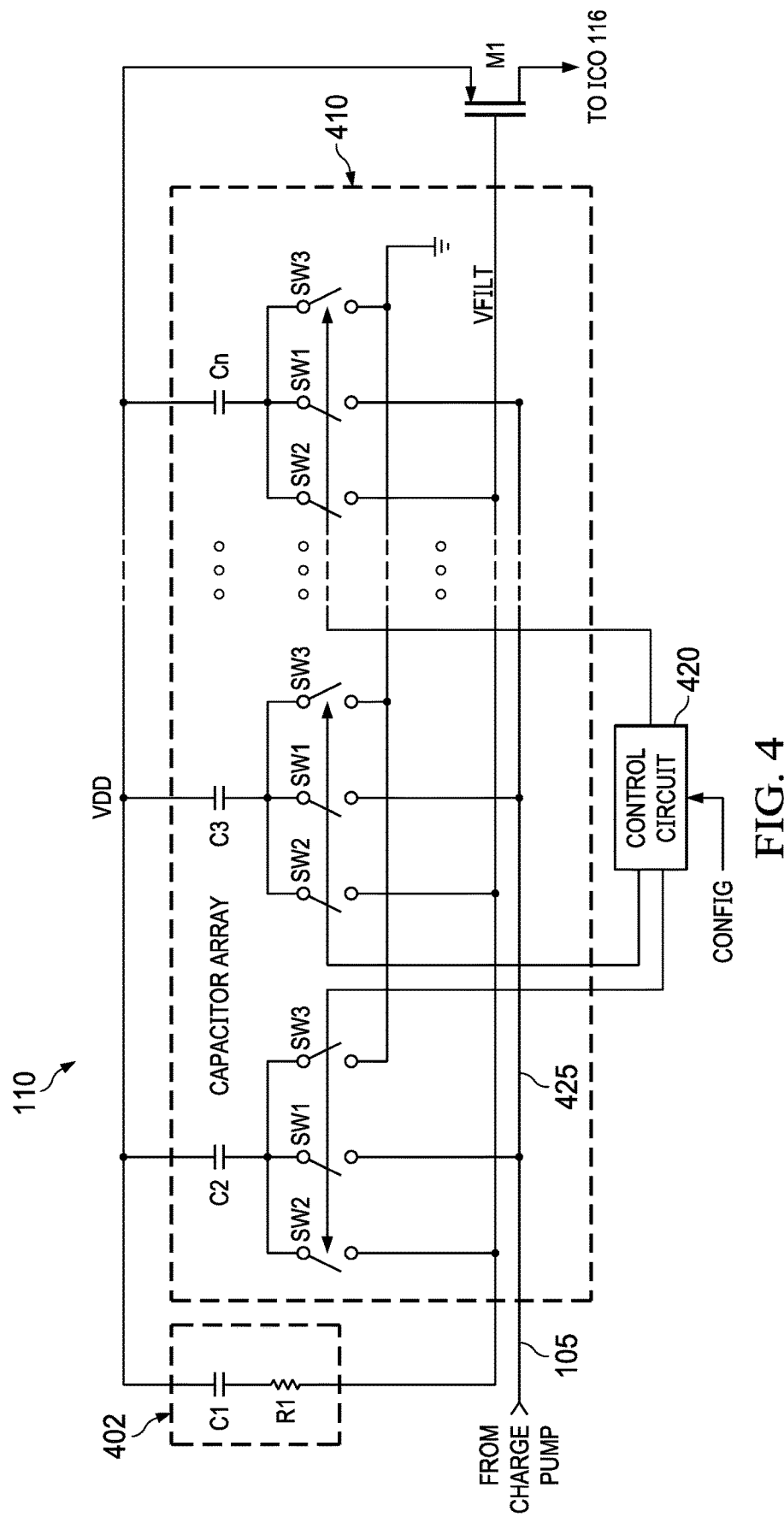
FIG. 4 shows an example of a loop filter usable in the analog phase-locked loop.

FIG. 4 shows an example of the loop filter 110. The illustrated loop filter 110 includes a first filter 402, a capacitor array 410, a control circuit 420, and a current source device M1. The first filter 402 in this example includes a capacitor C1 (also referred to as a filter capacitor) connected in series to a resistor R1. Capacitor C1 connects to supply voltage node (VDD) and resistor R1 connects to a control input of M1. In this example M1 is a p-type metal oxide semiconductor field effect transistor (PFET) and, as such resistor R1 connects to the gate of M1. In other implementations, M1 may be implemented as an n-type metal oxide semiconductor field effect transistor (NFET), as a p-type or n-type bipolar junction transistor, or as another type of transistor. The signal line between R1 and the control input to M1 is labeled as VFILT and represents the filtered output voltage from the loop filter 110, which is used to control the operating state of M1 and thus current magnitude to the ICO 116.

The capacitor array 410 includes a plurality of capacitors C2, C3, . . . , Cn. In some examples, the capacitor array 410 is implemented as a binary-weighted capacitor array which allows the PLL to operate over a wide range of input reference frequencies, although the capacitors need not be binary weighted in other implementations. As such, capacitors C2, C3, . . . , Cn have different capacitance values that are binary weighted. For example, the weightings of the capacitance values of the capacitors C2, C3, . . . , Cn may be 16C, 8C, 4C, etc. Capacitor C2 may be 16C and capacitor C3 may be 8C meaning that capacitor C2's capacitance value is double that of capacitor C3. In some implementations, capacitor C1 also is implemented as a configurable capacitor array (similar to capacitor array 410) to facilitate operability over a wide frequency range.

The loop filter 110 of FIG. 4 includes a plurality of first switches SW1, a plurality of second switches SW2, and a plurality of third switches SW3. Each capacitor C2, C3, . . . Cn connects to a set of first, second and third switches SW1-SW3 as shown. Each of first switches SW1 connects to each of the other first switches SW1 as well to the charge pump 104. Current from the charge pump 104 flows through switches SW1 to their respective capacitors C2, C3, . . . , Cn and current from the capacitors C2, C3, . . . Cn flows through the respective switch SW1 and to the charge pump 104. Each of the second switches SW2 connects to each of the other second switches SW2 and to the loop filter 402 (e.g., to the resistor R1) and to the control input of M1. Each of the third switches SW3 connects to each of the other third switches SW3 and either to a ground node as shown or another fixed voltage node to reduce their leakage current.

Node 425 connects to the charge pump 104 and first switches SW1, but not to the first filter 402 or the control input of M1. Instead, the control input of M1 is connected to second switches SW2 and the first filter 402. As such, the charge pump 104 is not connected to M1.

In some examples, first switches SW1 are binary-weighted like their corresponding capacitors C2, C3, . . . , Cn. The ratio of channel width (W) to channel length (L) of each switch SW1 is binary weighted. For example, a SW1 connected to C2 has a W/L ratio (e.g., 16*W/L) that is twice that of a SW1 connected to C3 (e.g., 8*W/L), and so on. The W/L ratios of switches S2 and S3 need not be binary weighted and can be smaller than switches SW1. The W/L ratios of switches SW2 can all be the same and the W/L ratios of switches SW2 also can all be the same, albeit different (or the same as) for switches SW2.

In practice, the switches create a parasitic capacitance to ground which injects supply noise into the ISO 116. Referring to FIG. 4, in the absence of any parasitic capacitance to ground, any noise on the voltage supply will also be directly coupled to the gate of M1 through the capacitors C2, C3, . . . , Cn. Thus, the supply noise seen at the gate of M1 would be zero. However, if there is a parasitic capacitance to ground from either VFILT or the gate of M1, there will be a potential division between C2, C3, . . . , Cn and the parasitic capacitance resulting in a non-zero supply noise component on the gate-to-source voltage of M1. The size of the parasitic capacitance is directly proportional to the sizes of the switches.

An advantage of the described examples is that the size (W/L) of the switches can be small, for the following reasons. A direct consequence of reducing the W/L of a metal oxide semiconductor (MOS) switch is that its resistance increases. The described architecture has the advantage that a higher switch resistance can be tolerated. To explain this advantage, consider the three sets of switches in FIG. 4 separately. The switches SW1 connect C2, C3, . . . , Cn to the charge pump 104 which generally has a high output resistance. Thus, the resistance of the switches SW1 can be relatively large without any significant effect on performance. The switches SW2 connect C2, C3, . . . , Cn to the filter 402 which contains a resistor R1 whose value is relatively large. As such, the resistance of SW2 can be relatively large. The switches SW3 are used to connect C2, C3, . . . , Cn to a dummy node when they are not used. Thus, the resistance of SW3 is for all practical purposes inconsequential and SW3 can be made arbitrarily small. By making switches SW3 relatively small, the parasitic capacitance at the gate of M1 can be reduced. The injection of supply noise into the gate-to-source voltage of M1 is reduced which in turn minimizes the effect of supply noise on the oscillator frequency. The control circuit 420 may be implemented as a controller, a finite state machine or other type of hardware device that can assert control signals to control the on and off state of the switches SW1-SW3. The control circuit 420 receives configuration information (CONFIG) which specifies which of the binary weighted capacitors C2, C3, . . . , Cn are to be included in operation of the loop filter 110. The configuration information may be stored in a register within the control circuit 420. Various combinations of capacitors C2, C3, . . . , Cn can be activated by the control circuit 420 based on the configuration information. For a given capacitor C2, C3, . . . , Cn to be activated, the control circuit 420 asserts control signals so as to turn on (close) the corresponding SW1 and SW2 switches for those particular capacitors and to turn off (opens) switch SW3 for those same capacitors. For all other capacitors not to be activated as part of the loop filter's operation, the control circuit 420 asserts control signals so as to turn off the corresponding SW1 and SW2 switches and turn on switch SW3 for those capacitors.

The current from M1 flows to the ICO 116, which produces OUTCLK 117 with a frequency that is a function of the current from M1. The frequency and phase of OUTCLK 117 is repeatedly adjusted so as to maintain frequency and phase lock between FBCLK 119 and REFCLK 101.

In this description, unless otherwise qualified, the terms "connect," "connected," "couple," or "couples" include an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
 a charge pump to receive voltage pulses indicative of a phase error between a reference clock and a feedback clock and to generate current pulses based on the voltage pulses;
 a loop filter coupled to the charge pump, wherein the loop filter includes:
  a current source device that includes a source coupled to a supply voltage node, a gate, and a drain;
  a binary-weighted capacitor array that includes a plurality of capacitors that each include a first terminal coupled to the supply voltage node and a second terminal, wherein each capacitor of the binary-weighted capacitor array has a capacitance value that is binary-weighted with respect to each of the other binary-weighted capacitors;
  a plurality of first switches, wherein:
   each switch of the plurality of first switches is coupled between the second terminal of a respective capacitor of the plurality of capacitors and the charge pump;

each of the first switches has a width and a length; and a ratio of the width to the length associated with each of the first switches is binary-weighted with respect to the ratio of the width to the length of each of the other first switches; and a plurality of second switches, wherein each switch of the plurality of second switches is coupled between the second terminal of a respective capacitor of the plurality of capacitors and the gate of the current source device; and a current controlled oscillator coupled to the drain of the current source device, the current controlled oscillator to generate an output clock at a frequency based on current from the current source device.

2. The circuit of claim 1, further comprising a plurality of third switches, wherein each switch of the plurality of third switches is coupled between the second terminal of a respective capacitor of the plurality of capacitors and a ground node.

3. The circuit of claim 2, further comprising a control circuit to generate control signals to control on/off states of the first, second, and third switches associated with each capacitor of the binary-weighted capacitor array, wherein for each capacitor, the control circuit is to control the third switch to be off while the first and second switches are on and to control the third switch to be on while the first and second switches are off.

4. The circuit of claim 1, wherein the ratio of the width to the length of each of the second switches is approximately equal to the ratio of the width to the length of each of the other second switches.

5. The circuit of claim 1, wherein the loop filter further includes a first filter that includes a first filter capacitor coupled to the supply voltage node and includes a resistor coupled between the first filter capacitor and the current source device.

6. The circuit of claim 1, further comprising a control circuit to generate control signals to control on/off states of the plurality of first switches and the plurality of second switches, wherein the control circuit is to control more than one of the plurality of first switches to be on concurrently.

7. A circuit, comprising:
a charge pump input;
a first filter coupled to a supply voltage node;
a plurality of binary-weighted capacitors that each include a first terminal coupled to the supply voltage node and a second terminal;
a current source device that includes a first terminal coupled to the supply voltage node, a second terminal, and a gate;
a first plurality of switches, wherein:
each of the first plurality of switches is coupled between the second terminal of a respective capacitor of the plurality of binary-weighted capacitors and the charge pump input;
each switch of the first plurality of switches has a width and a length; and
a ratio of the width to the length associated with each of the first switches is binary weighted with respect to the ratio of the width to the length of each of the other first switches; and
a second plurality of switches, wherein each of the second plurality of switches is coupled between the second terminal of a respective capacitor of the plurality of binary-weighted capacitors and the gate of the current source device.

8. The circuit of claim 7, further comprising a charge pump coupled to the charge pump input.

9. The circuit of claim 7, further comprising a third plurality of switches, wherein each of the third plurality of switches is coupled between the second terminal of a respective capacitor of the plurality of binary-weighted capacitors and a ground node.

10. The circuit of claim 9, further comprising a control circuit to generate control signals to control on/off states of the first, second, and third switches associated with each capacitor of the plurality of binary-weighted capacitors, wherein for each capacitor, the control circuit is to control the third switch to be off while the first and second switches are on and to control the third switch to be on while the first and second switches are off.

11. The circuit of claim 7, wherein a ratio of width to length of each switch of the second plurality of switches is approximately equal to the ratio of width to length of each of the other switches of the second plurality of switches.

12. The circuit of claim 7, wherein the first filter includes a resistor coupled to the current source device and includes a first filter capacitor coupled between the resistor and the supply voltage node.

13. The circuit of claim 7, wherein each of the first plurality of switches directly couples a single capacitor of the plurality of binary-weighted capacitors to the charge pump input.

14. A circuit, comprising:
a loop filter that includes:
a charge pump input;
a current source device;
a first filter coupled between a supply voltage node and the current source device;
a capacitor array coupled to the first filter, wherein the capacitor array comprises a plurality of capacitors;
a plurality of first switches, wherein each switch of the plurality of first switches is coupled between a respective capacitor of the plurality of capacitors and the charge pump input;
a plurality of second switches, wherein each switch of the plurality of second switches is coupled between a respective capacitor of the plurality of capacitors and the current source device; and
a plurality of third switches, wherein each switch of the plurality of third switches is coupled between a respective capacitor of the plurality of capacitors and a ground node; and
a current controlled oscillator coupled to the current source device, the current controlled oscillator to generate an output clock at a frequency based on current from the current source device.

15. The circuit of claim 14, wherein the capacitor array comprises a binary-weighted capacitor array.

16. The circuit of claim 14, further comprising a control circuit to generate control signals to control on/off states of the first, second, and third switches associated with each capacitor of the capacitor array, wherein for each capacitor, the control circuit is to control the third switch to be off while the first and second switches are on and to control the third switch to be on while the first and second switches are off.

17. The circuit of claim 14, further comprising a charge pump coupled to the charge pump input.

18. The circuit of claim 14, wherein each of the second switches is coupled to a control input of the current source device, and none of the first nor the third switches is coupled to the control input.

* * * * *